SEMICONDUCTOR CAPACITOR

Filed Dec. 24, 1958 2 Sheets-Sheet 1

INVENTORS: E.I. DOUCETTE
C.J. SPECTOR
BY H.W. Lockhart
ATTORNEY

SEMICONDUCTOR CAPACITOR

Filed Dec. 24, 1958 2 Sheets-Sheet 2

INVENTORS: E. I. DOUCETTE
C. J. SPECTOR
BY [signature]
ATTORNEY

United States Patent Office 2,989,650

Patented June 20, 1961

2,989,650

SEMICONDUCTOR CAPACITOR

Edward I. Doucette, Summit, and Clarence J. Spector, Gillette, N.J., assignors to Bell Telephone Laboratories, Incorporated, New York, N.Y., a corporation of New York Filed Dec. 24, 1958, Ser. No. 782,821

12 Claims. (Cl. 307—88)

This invention relates to semiconductor capacitors and, more particularly, to a semiconductor variable capacitor.

It is well known that a semiconductor PN junction exhibits capacitance as a result of the dielectric effect of the depletion layer existing on both sides of the PN boundary. This depletion layer, or space charge region, exists as a result of the impurity content and distribution in the semiconductor material and is altered by the application of a voltage across the PN junction. For example, the application of an increasing voltage in the reverse direction across the junction produces an enlargement of the depletion layer.

As in the conventional capacitor, the capacitance of the semiconductor PN junction is directly proportional to the area of the boundary depletion layer and inversely proportional to its thickness. Thus, the conventional semiconductor PN junction device exhibits a capacitance variation which is a result only of the change in depletion layer thickness with changes in the voltage applied across the junction. In many circuit arrangements it is desirable to provide a change in capacitance or tuning characteristic of a different kind than that produced simply by the change in depletion layer thickness with bias voltage. More specifically, it is desirable to provide a greater capacitance change for a given change in voltage, thereby to enable more rapid tuning of the circuit.

Therefore, one broad object of this invention is an improved semiconductor capacitor.

A more specific object is a semiconductor capacitor having improved tuning characteristics and a further object is a semiconductor capacitor having a capacitance-voltage characteristic which departs significantly from the capacitance-voltage characteristic of conventional semiconductor PN junction devices.

One specific embodiment in accordance with this invention comprises a semiconductor PN junction diode in the form of a thin rectangular wafer having a PN junction parallel to the major plane of the wafer and having low resistance contacts on the opposite faces of the wafer. In such a semiconductor diode, made, for example, from single crystal silicon, the PN junction may be produced within the wafer by solid state diffusion, thus providing a relatively large area substantially planar junction through the wafer. Thus, adjacent to one face of the wafer is a P-type conductivity region and adjacent to the other major face of the wafer is a region of N-type conductivity. In this specific embodiment, the surface of the P-type region is shaped so that the thickness of the region as measured from the PN junction to the surface is gradually reduced by sloping at a very slight angle from near the center toward the opposite edges of the rectangular wafer. Thus, one face of the wafer in cross section has the appearance of a gabled roof with a small plateau on the top to which low resistance contact is made. Most advantageously, the angle of the sloping portions of the face of the wafer is small and equal to or not greatly in excess of one degree. However, operative devices may be constructed having surfaces at angles up to near 90 degrees. Further the variation in thickness may be achieved using curved surfaces as well as plane.

The specific structure described above provides a unique variation in the capacitance exhibited across the terminals of the diode as a result of the effect of the particular geometry upon the growth of the depletion layer with change in applied bias. As described hereinbefore, change in the capacitance in previously known devices is solely a result of the change in depletion layer thickness. However, in the device of this invention this effect is augmented and enhanced by the change in the area of the parallel plates of the semiconductor capacitor as represented by the boundaries of the depletion layer. Thus, at low reverse bias, the depletion layer boundaries are close to the PN junction and the entire cross-sectional area of the wafer constitutes the area of the capacitor. As the reverse bias increases and the depletion layer increases in thickness, the boundary of the depletion layer in the P-type region intersects the sloping surfaces of the P-type region. From this bias condition to higher values of reverse bias, the area of the semiconductor capacitor decreases through a considerable range depending upon the particular dimensions of the device until the condition, termed punch-through, in which the depletion layer boundary intersects a low resistance portion, is reached. In this range of reverse voltages in which one boundary of the depletion layer is changing in area, the semiconductor device is susceptible of extremely rapid and sensitive capacitance control. Because this change in capacitance results from what is, effectively, a real change in area, the tuning characteristic is substantially independent of changes in frequency.

Therefore, one feature of this invention is a PN junction diode in which at least one conductivity-type region has a varying thickness dimension.

More particularly, one feature of this invention is a PN junction diode in which one major face has a very gradual slope so as to make a small angle with the plane of the junction.

The invention and its other objects and features will be better understood from a detailed consideration of the following description taken in connection with the drawing in which.

Figure 1:
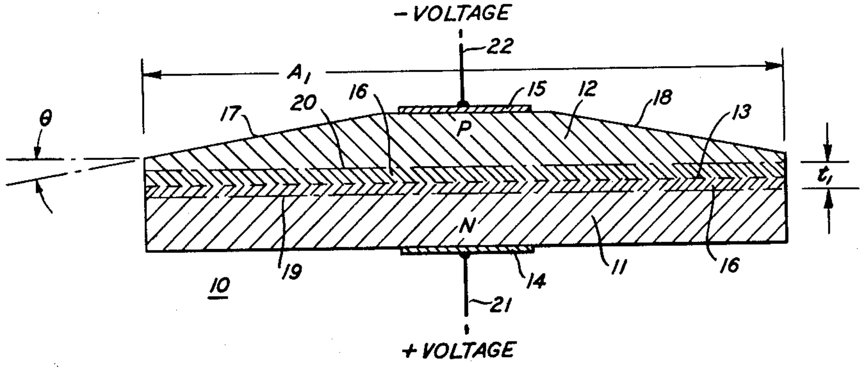
FIGS. 1 and 2 show in diagrammatic cross section one form of a PN junction capacitor in accordance with this invention.

As has been set forth above, the capacitance C of a parallel plate capacitor is proportional to $$\frac{A}{t}$$

where A is the area of one plate, the smaller if they differ in area, and $t$ is the plate separation. FIG. 1 depicts in diagrammatic form a cross section of a PN junction diode 10 comprising a wafer of single crystal semiconductive material such as germanium or silicon. The wafer 10 comprises a region 11 of N-type conductivity adjacent one major face and a region of P-type conductivity 12 adjacent the other major face. The boundary of the two regions defines a PN junction 13. Electrical connection is provided by means of low resistance contacts 14 and 15 to the N and P-type regions, respectively. The shaded area 16, extending on both sides of the PN junction 13, represents the depletion layer or space charge region associated with the PN junction. The extent of the depletion layer is dependent primarily upon the impurity concentration and distribution in the semiconductive material immediately adjacent the junction and upon the voltage applied across the junction to the electrodes 14 and 15. Under certain conditions of impurity distribution, a depletion layer exists even in the absence of an applied voltage. Thus, a depletion layer may exist even with a forward bias voltage. However, the thickness of the depletion layer increases in width as the voltage is increased in the reverse direction. For purposes of explanation, it will be understood that the condition illustrated by FIG. 1 obtains with the application of a comparatively low reverse bias.

The structure depicted in FIG. 1 is exaggerated dimensionally in certain respects to enable a better understanding of the operation of the device. For example, the slope of the faces 17 and 18 of the P-type region 12 is much greater than that typical of an exemplary device. As suggested hereinbefore, the slope ideally is less than about five degrees and for the most advantageous operation is close to one degree. With the device in the bias condition depicted by FIG. 1, both boundaries 19 and 20 of the depletion layer extend the entire cross section of the wafer 10. This dimension has been denoted $A_1$. Thus, in FIG. 1 the capacitance of the device is directly proportional to $A_1$ and indirectly proportional to the thickness $t_1$.

Figure 2:
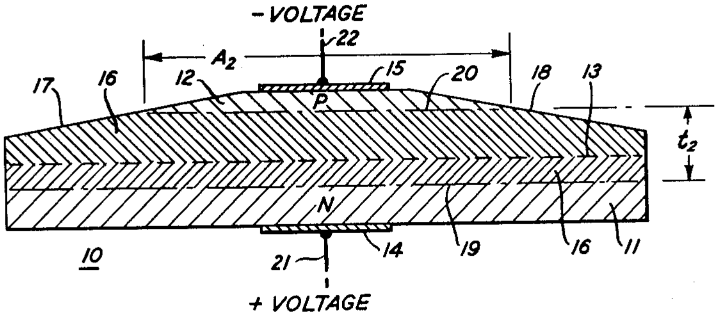

Turning to FIG. 2, there is shown the condition existing after an increase in the reverse voltage across the diode. The increase in reverse bias increases the depletion layer thickness to the dimension $t_2$. This has the effect of reducing the capacitance. However, the effect of the sloping faces 17 and 18 is to reduce the area of the upper boundary 20 of the depletion layer. This, in effect, reduces the capacitance which is directly proportional to the area of the smaller plate. Thus, the reduction in the area of the semiconductor capacitor to the dimension $A_2$ results in a further reduction in the capacitance of the diode and both changes are cumulative, thereby producing a greater reduction in the overall capacitance of the device with change in bias than for the conventional junction diode.

Figure 3:
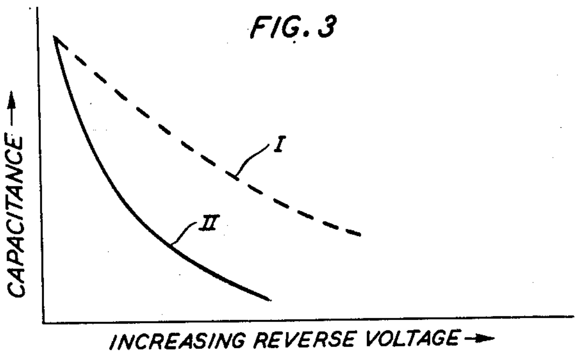
FIG. 3 is a graph showing the capacitance-voltage relation for the conventional semiconductor PN junction device as compared to the capacitance-voltage characteristic for the device of FIGS. 1 and 2.

This effect on capacitance is shown in graphic form in the curves of FIG. 3. FIG. 3 is a graph having capacitance as the ordinate versus reverse voltage as the abscissa. Curve I represents the change in capacitance with change in bias of a conventional PN junction device in which the area of the depletion layer boundaries is unchanged as the depletion layer thickness changes. Curve II, on the other hand, shows the more pronounced change in capacitance with reverse bias exhibited by the device of this invention in which the area of one boundary of the depletion layer is changed by the particular geometry of the semiconductor device. It is apparent from this graphical representation that considerably more rapid tuning is possible following the characteristic of curve II as compared to that of curve I.

The device of FIG. 1, which, for example, may comprise a single crystal wafer of silicon, may be produced using techniques such as solid state diffusion which are well known in the art. In one example, a square wafer of N-type silicon, .030 inch on a side and .007 inch thick, was coated on one face with a suspension containing boron pentoxide. The wafer was heated in a diffusion furnace in an atmosphere of nitrogen at a temperature of 1300 degrees centigrade for a period of 12 hours to alter the conductivity of the wafer to P-type to a depth of .0005 inch from the coated face. Successive nickel and gold platings then were applied to both faces of the wafer to provide low resistance electrodes 14 and 15. The wafer was then placed in a precision lapping jig and by abrasive lapping opposed sloping surfaces were produced on the P-type face so that opposite edges of the wafer tapered at an angle of one degree toward the center to leave a strip about .002 inch wide of the original surface of the P-type region. Finally, the leads 21 and 22 were attached to the electrodes 14 and 15 by means of thermo-compression bonding.

The above-noted lapping step requires some care in order to produce a plane surface at the slight angle which results in optimum performance. The angle between the plane of the sloping faces 17 and 18 is about one degree. However, angles up to about five degrees also will provide structures having optimum capacitance-voltage characteristics. It can be seen that the smaller the angle of intersection the greater the change in the depletion boundary area (A) for a given change in thickness ($t$).

It is apparent that the range of operation of the device of FIGS. 1 and 2 as a capacitance element extends from the condition at which a depletion layer having a thickness sufficient to store a charge exists to the condition at which a boundary of the depletion layer is sufficiently close to an electrode connection to result in punch-through. The first condition may be associated with the bias condition which is just slightly more negative than that which will produce forward injection. The other condition is a function, to some extent, of the geometry of the device and represents the condition at which the depletion layer intersects some portion of the low resistance electrode. It is apparent from the latter condition that it is important that the electrode 15 be applied to the part of the P-type region furthermost from the junction 13.

The invention has been described thus far in terms of a single embodiment which is presently preferred from the standpoint of performance and ease of fabrication. It will be understood that a variety of semiconductor configurations also may be used to practice the invention. For example, a multiplicity of sloping faces may be provided with the ultimate structure, of course, comprising a frustum of a cone. Such a structure may be produced by employing etching or ultrasonic shaping techniques. Or, instead of two sloping faces 17 and 18 as shown in the device of FIG. 1, a single plane sloping face may be provided. Such a structure can be produced by using the preferential alloying characteristics of single crystals. For example, it is known that alloying in silicon occurs most rapidly along the (1,1,1) axis. Thus, alloying from a plated surface which is misoriented by about a degree or so from the (1,1,1) crystallographic axis results in a substantially planar junction which is perpendicular to the (1,1,1) axis and which makes an angle with the plane of the surface equal to the amount of misorientation.

Figure 4:
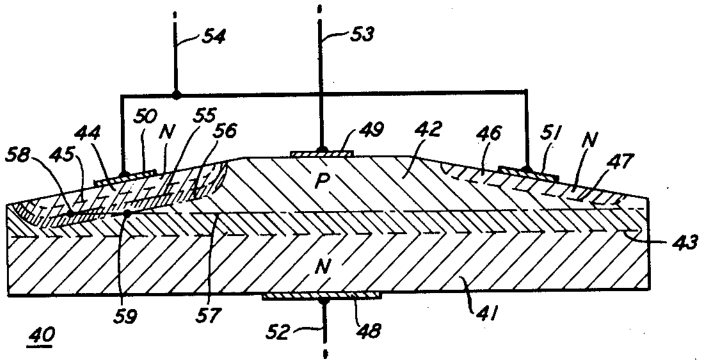
FIG. 4 is a diagrammatic cross section of another embodiment of the invention.

Another form of the invention is shown in FIG. 4 wherein the device comprises a body of single crystal silicon 40 which has sloping surfaces similar to the structure of the device of FIG. 1. However, in addition to the substantially planar PN junction 43, additional N-type conductivity regions 44 and 46 are provided adjacent the sloping faces. These regions produce PN junctions 45 and 47 and may be provided by any one of several techniques well known in the art, for example, by diffusing an N-type impurity into an area limited by a suitable mask, such as silicon oxide, generally in accordance with the techniques disclosed in the application of J. Andrus, Serial No. 678,411, filed August 15, 1957. The device shown in FIG. 4 is a three-terminal element having ohmic electrode 48 to the lower N-type region, and a similar electrode 49 to the P-type region, and electrodes 50 and 51 making low resistance contact with the N-type regions 44 and 46 and connected to a common terminal 54.

Figure 5:
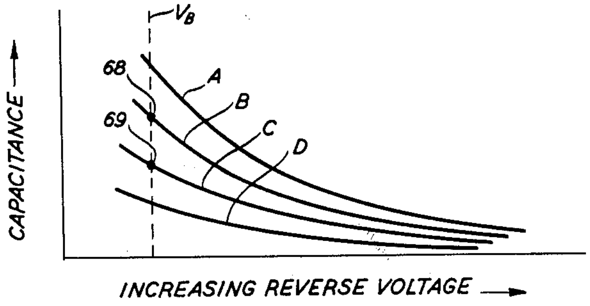
FIG. 5 is a graph showing the characteristic of the device of FIG. 4.

The characteristics of the device of FIG. 4 are illustrated by the graph of FIG. 5.

The extent of the depletion layers of the several PN junctions is shown in broken line form in FIG. 4. Thus, a low reverse bias applied between the terminal 54 and the terminal 53 results in a depletion layer boundary 55 in the P-type region adjacent the junction 45. It will be understood that a similar layer not shown is associated with the junction 47 and that the depletion layer exists also within the N-type regions 44 and 46. However, for ease of explanation the interaction of the depletion layers in only one portion of the device is shown.

If the reverse bias across the junction 45 is increased, the depletion layer is enlarged as indicated by the broken line 56. The effect of the interaction of the depletion layer boundaries is shown in FIG. 5. Curve A is the characteristic for the two-terminal tapered structure of FIGS. 1 and 2. Curve B may be regarded as the characteristic for the device of FIG. 4 with a fixed value of reverse bias between the third terminal 54 and terminal 53 which produces the depletion layer 55. Curve C is the characteristic corresponding to depletion layer boundary 56, and curve D for an even greater bias voltage between terminals 54 and 53. The broken line 57 in FIG. 4 represents a portion of the boundary of the depletion layer of the PN junction 43 for a given value of reverse bias across the terminals 52 and 53. This value of reverse bias is defined by the broken vertical line denoted $V_b$ in the graph of FIG. 5.

It is evident that the boundary 57 intersects the boundaries 55 and 56 at different points 58 and 59, respectively, and that the point 58 defines a greater length and correspondingly, area, and hence a greater value of capacitance than the similar values for point 59. This is illustrated by noting the coordinates of the 68 and 69, corresponding respectively to the conditions defined by points 58 and 59 of FIG. 4. Thus, the three-terminal embodiment of this invention provides a third or control electrode which enhances the flexibility of operation and extends the range of operation of the variable junction capacitor.

Figure 6:
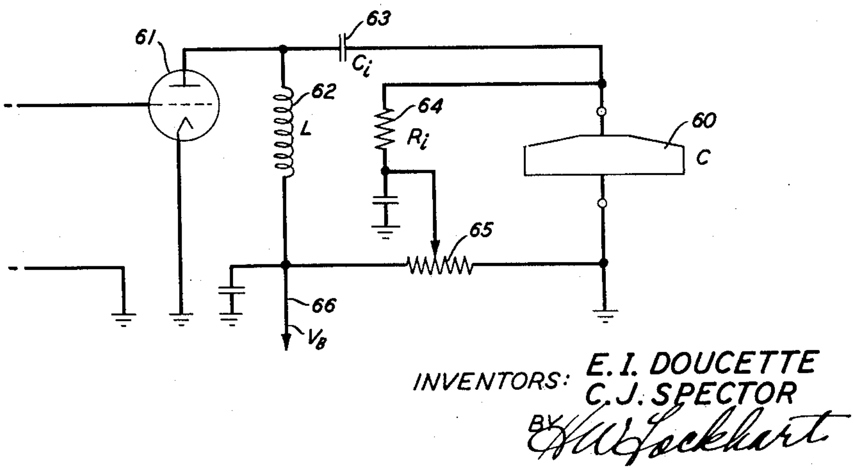
FIG. 6 is a schematic circuit arrangement incorporating the variable capacitance device in accordance with this invention.

FIG. 6 shows in schematic form a simple amplifier circuit using the variable solid state capacitor in accordance with this invention. A variable solid state capacitor represented by the box 60 is connected in a conventional shunt configuration with an inductance 62. A variable resistor 65 for tuning the capacitor 60 is connected in series therewith and may include an isolating resistor 64. The tuning circuit includes also an isolating capacitor 63 and the supply voltage $V_b$ is applied at the terminal 66. As is well known, the tuning circuit shown may be used to control the output of a triode 61. It will be apparent from the foregoing that very slight changes in the resistance 65 will provide rapid and stable tuning of the variable capacitor 60.

In connection with this disclosure of a solid state variable capacitor, reference is made to another application, Serial No. 782,778, filed this date by us, now Patent 2,964,648, issued December 13, 1960, which discloses another solid state variable capacitor utilizing different principles of operation and a different structure from that disclosed herein. One very important advantage of the solid state variable capacitor of this invention, in which the change in the area of the capacitance represented by the depletion layer boundaries is a real change with bias change, is that the change in capacitance with voltage is substantially independent of the frequency of the load.

Although the invention has been disclosed in terms of certain specific embodiments, it will be understood that they are but illustrative and that other arrangements may be devised by those skilled in the art which likewise will be within the spirit and scope of the invention.

What is claimed is:

1. A semiconductor device for use as a variable capacitor comprising a body of semiconductor material, said body including a P-type conductivity region and an N-type conductivity region, said regions defining a PN junction therebetween, a substantially ohmic connection to each said region, at least one of said regions having a nonuniform thickness of semiconductor material between the PN junction and the surface opposite said junction, said one region having a configuration such that the cross sectional area parallel to the PN junction changes with distance from the PN junction, the ohmic connection to said one region being applied to the portion of maximum thickness, each said region being free of any other connections.

2. A semiconductor device for use as a variable capacitor comprising a body of semiconductor material, said body including a P-type conductivity region and an N-type conductivity region, said regions defining a substantially planar PN junction therebetween, a substantially ohmic connection to each said region, at least one of said regions having a substantially planar portion on the major surface of said region in a plane which intersects the plane of said junction at a slight angle, said one region having a configuration such that the cross sectional area parallel to the PN junction changes with distance from the PN junction, the ohmic connection to said one region being applied to the portion of said major surface furthermost from said PN junction, each said region being free of any other connections.

3. A semiconductor device for use as a variable capacitor comprising a body of semiconductor material, said body including a P-type conductivity region and an N-type conductivity region, said regions defining a substantially planar PN junction therebetween, a substantially ohmic connection to each said region, at least one of said regions having a pair of substantially planar portions on the major surface of said region, each said portion being in a plane which intersects the plane of said junction at a slight angle, each said portion being adjacent opposite edges of said body and disposed so as to diverge from the plane of said PN junction in the direction inward from said edges, whereby the midportion of said major surface is furthermost from said junction, said one region having a configuration such that the cross sectional area parallel to the PN junction changes with distance from the PN junction, the ohmic connection to said one region being applied to said midportion, each said region being free of any other connections.

4. A semiconductor device for use as a variable capacitor comprising a wafer of semiconductor material, said wafer including a P-type conductivity region adjacent one major surface of said wafer and an N-type conductivity region adjacent the other major surface of said wafer, said regions defining a substantially planar PN junction therebetween, a substantially ohmic connection to each said region, at least one of said regions having a substantially planar portion on the major surface thereof in a plane which intersects the plane of said junction at an angle of about one degree, said one region having a configuration such that the cross sectional area parallel to the PN junction changes with distance from the PN junction, the ohmic connection to said one region being applied to the portion of said major surface furthermost from said PN junction, each said region being free of any other connections.

5. A semiconductor device for use as a variable capacitor comprising a wafer of semiconductor material, said wafer including a P-type conductivity region adjacent one major surface of said wafer and an N-type conductivity region adjacent the other major surface of said wafer, said regions defining a substantially planar PN junction therebetween, a substantially ohmic connection to each said region, at least one of said regions having a pair of substantially planar portions on the major surface of said region, each said portion being in a plane which intersects the plane of said junction at an angle of about one degree, each said portion being adjacent opposite edges of said body and disposed so as to diverge from the plane of said PN junction in the direction inward from said edges, whereby the midportion of said major surface is furthermost from said junction, said one region having a configuration such that the cross sectional area parallel to the PN junction changes with distance from the PN junction, the ohmic connection to said one region being applied to said midportion, each said region being free of any other connections.

6. A variable semiconductor capacitor comprising in combination a body of semiconductor material, said body including a P-type conductivity region and an N-type conductivity region, said regions defining a PN junction therebetween, a substantially ohmic connection to each said region, at least one of said regions having a nonuniform thickness of semiconductor material between the PN junction and the surface opposite said junction, said one region having a configuration such that the cross sectional area parallel to the PN junction changes with distance from the PN junction, the ohmic connection to said one region being applied to the portion of maximum thickness, each said region being free of any other connections, and means for applying a voltage across said connections in the range from just below the value which causes forward injection to just above the value which causes reverse breakdown.

7. A variable semiconductor capacitor comprising in combination a body of semiconductor material, said body including a P-type conductivity region and an N-type conductivity region, said regions defining a substantially planar PN junction therebetween, a substantially ohmic connection to each said region, at least one of said regions having a substantially planar portion on the major surface of said region in a plane which intersects the plane of said junction at a slight angle, said one region having a configuration such that the cross sectional area parallel to the PN junction changes with distance from the PN junction, the ohmic connection to said one region being applied to the portion of said major surface furthermost from said PN junction, each said region being free of any other connections, and means for applying a voltage across said connections in the range from just below the value which causes forward injection to just above the value which causes reverse breakdown.

8. A variable semiconductor capacitor comprising in combination a body of semiconductor material, said body including a P-type conductivity region and an N-type conductivity region, said regions defining a substantially planar PN junction therebetween, a substantially ohmic connection to each said region, at least one of said regions having a pair of substantially planar portions on the major surface of said region, each said portion being in a plane which intersects the plane of said junction at a slight angle, each said portion being adjacent opposite edges of said body and disposed so as to diverge from the plane of said PN junction in the direction inward from said edges, whereby the midportion of said major surface is furthermost from said junction, said one region having a configuration such that the cross sectional area parallel to the PN junction changes with distance from the PN junction, the ohmic connection to said one region being applied to said midportion, each said region being free of any other connections, and means for applying a voltage across said connections in the range from just below the value which causes forward injection to just above the value which causes reverse breakdown.

9. A variable semiconductor capacitor comprising in combination a wafer of semiconductor material, said wafer including a P-type conductivity region adjacent one major surface of said wafer and an N-type conductivity region adjacent the other major surface of said wafer, said regions defining a substantially planar PN junction therebetween, a substantially ohmic connection to each said region, at least one of said regions having a substantially planar portion on the major surface thereof in a plane which intersects the plane of said junction at an angle of about one degree, said one region having a configuration such that the cross sectional area parallel to the PN junction changes with distance from the PN junction, the ohmic connection to said one region being applied to the portion of said major surface furthermost from said PN junction, each said region being free of any other connections, and means for applying a voltage across said connections in the range from just below the value which causes forward injection to just above the value which causes reverse breakdown.

10. A variable semiconductor capacitor comprising in combination a wafer of semiconductor material, said wafer including a P-type conductivity region adjacent one major surface of said wafer and an N-type conductivity region adjacent the other major surface of said wafer, said regions defining a substantially planar PN junction therebetween, a substantially ohmic connection to each said region, at least one of said regions having a pair of substantially planar portions on the major surface of said region, each said portion being in a plane which intersects the plane of said junction at an angle of about one degree, each said portion being adjacent opposite edges of said body and disposed so as to diverge from the plane of said PN junction in the direction inward from said edges, whereby the midportion of said major surface is furthermost from said junction, said one region having a configuration such that the cross sectional area parallel to the PN junction changes with distance from the PN junction, the ohmic connection to said one region being applied to said midportion, each said region being free of any other connections, and means for applying a voltage across said connections in the range from just below the value which causes forward injection to just above the value which causes reverse breakdown.

11. A semiconductor device for use as a variable capacitor comprising a wafer of semiconductor material, said wafer including a region of one conductivity type adjacent one major surface of said wafer and a region of opposite conductivity type adjacent the other major surface of said wafer, said regions defining a substantially planar PN junction therebetween, a substantially ohmic connection to each said region, said connections forming a first and a second terminal, respectively, of said device, at least one of said regions having a pair of substantially planar portions on the major surface of said region, each said portion being in a plane which intersects the plane of said junction at an angle of about one degree, each said portion being adjacent to opposite edges of said body and disposed so as to diverge from the plane of said PN junction in the direction inward from said edges, whereby the midportion of said major surface is furthermost from said junction, said one region having a configuration such that the cross sectional area parallel to the PN junction changes with distance from the PN junction, the ohmic connection to said one region being applied to said midportion, a pair of thin regions of conductivity type opposite to that of said one region adjacent to a portion of each of the substantially planar portions on the major surface of said region, a substantially ohmic connection to each said thin region, said connections to said thin regions being joined electrically to a third terminal, each of said regions being free of any other connections.

12. A variable semiconductor capacitor comprising in combination a semiconductor device in accordance with claim 11, and first voltage means for applying a reverse bias across said ohmic connection to said one region and the ohmic connection to said other region, and second voltage means for applying a reverse bias across said third terminal and said ohmic connection to said one region.

References Cited in the file of this patent

UNITED STATES PATENTS

| | | |
|---|---|---|
| 2,600,500 | Haynes et al. | June 17, 1952 |
| 2,672,528 | Shockley | Mar. 16, 1954 |
| 2,836,776 | Ishikawa et al. | May 27, 1958 |
| 2,884,607 | Uhlir | Apr. 28, 1959 |

FOREIGN PATENTS

| | | |
|---|---|---|
| 1,097,337 | France | Feb. 16, 1955 |

Notice of Adverse Decision in Interference

In Interference No. 94,944 involving Patent No. 2,989,650, E. I. Doucette and C. J. Spector, SEMICONDUCTOR CAPACITOR, final judgment adverse to the patentees was rendered Dec. 22, 1965, as to claims 1, 2 and 4.

[*Official Gazette February 15, 1966.*]